(12) United States Patent
Ho et al.

(10) Patent No.: US 7,173,341 B2
(45) Date of Patent: Feb. 6, 2007

(54) HIGH PERFORMANCE THERMALLY ENHANCED PACKAGE AND METHOD OF FABRICATING THE SAME

(75) Inventors: Kwun-Yao Ho, Hsin-Tien (TW); Moriss Kung, Hsin-Tien (TW)

(73) Assignee: Via Technologies, Inc., Taipei Hsien (TW)

( * ) Notice: Subject to any disclaimer, the term of this patent is extended or adjusted under 35 U.S.C. 154(b) by 353 days.

(21) Appl. No.: 10/368,337

(22) Filed: Feb. 18, 2003

(65) Prior Publication Data

US 2004/0036154 A1  Feb. 26, 2004

(30) Foreign Application Priority Data

Aug. 23, 2002   (TW) ................ 91119089 A

(51) Int. Cl.
*H01L 29/40*   (2006.01)

(52) U.S. Cl. ..................... 257/778; 257/712
(58) Field of Classification Search ............... 257/678, 257/778, 712, 713, 706, 704
See application file for complete search history.

(56) References Cited

U.S. PATENT DOCUMENTS 6,469,897 B2 * 10/2002 Ho et al. .............. 361/704

* cited by examiner

*Primary Examiner*—Roy Karl Potter
(74) *Attorney, Agent, or Firm*—J.C. Patents

(57) ABSTRACT

A high performance thermally enhanced package and method of fabricating the same is provided. A chip (a wire bond chip or a flip chip) and a carrier (lead frame or tape carrier) are bonded together using flip-chip technology and thermal compression. The chip and the carrier are encapsulated using a molding compound. The package has a smaller overall size and the capacity to withstand electromagnetic interference.

24 Claims, 9 Drawing Sheets

US 7,173,341 B2

HIGH PERFORMANCE THERMALLY ENHANCED PACKAGE AND METHOD OF FABRICATING THE SAME

CROSS-REFERENCE TO RELATED APPLICATION

This application claims the priority benefit of Taiwan application serial no. 91119089, filed Aug. 23, 2002.

BACKGROUND OF THE INVENTION

1. Field of Invention

The present invention relates to a high performance thermally enhanced package. More particularly, the present invention relates to a high performance thermally enhanced package with a cavity type heat sink therein and a method of fabricating the same.

2. Description of Related Art

In this information conscious society, multi-media applications are developed at a tremendous pace. To complement this trend, integrated circuit packages inside electronic devices must match a set of corresponding demands for digital input, networking, local area connection and personalized usage. In other words, each electronic device must be highly integrated so that more powerful programs can be executed at a higher speed and yet each package has to occupy less space and cost less. Due to the miniaturization and densification of integrated circuit packages, most packages have an edge length only 1.2 times the encapsulated chip or a package area 1.25 times the chip area. Hence, each package is able to provide powerful functions within a very small area. Furthermore, each chip package can be easily mounted on a printed circuit board using standard surface mount technology (SMT) and common equipment. Therefore, chip packages are mostly welcomed by the industry. The most common types of chip packages include bump chip carrier (BCC) package, quad flat nonleaded (QFN) package and lead frame type package.

FIG. 1 is a schematic cross-sectional view of a conventional bump chip carrier package. As shown in FIG. 1, the bump chip carrier (BCC) package mainly comprises a silicon chip 110, a layer of adhesive glue 104, a plurality of bonding wires 106, a plurality of terminals 108 and a plastic package body 110. The chip 100 has a plurality of bonding pads 102 on its front surface and contains a layer of adhesive glue 104 on its back surface. The bonding pads 102 on the chip 100 are electrically connected to the terminals 108 through the bonding wires 106. The plastic package body 110 encapsulates the chip 100 and the bonding wires 106. In addition, the adhesive glue 104 at the back surface of the chip 100 is exposed outside the plastic body 110. Through the terminals 108, the chip 100 can communicate electrically with other electronic devices or a host board. However, to produce this type of package structure, an etching operation is needed to expose the adhesive glue 104 at the back of the chip 100 and shape the terminals 108. Hence, the structure is a bit complicated to fabricate.

FIG. 2 is a schematic cross-sectional view of a conventional quad flat nonleaded package. As shown in FIG. 2, the quad flat nonleaded (QFN) package mainly comprises a chip 200, a layer of adhesive glue 204, a plurality of bonding wires 206a, a plurality of bonding wires 206b, a lead frame 208 and a plastic package body 210. The lead frame 208 has a die pad 208a and a plurality of leads 208b. The chip 200 has a plurality of bonding pads 202 on the upper surface. The back surface of the chip 200 is attached to the die pad 208a through the adhesive glue layer 204. A portion of the bonding pads 202 on the upper surface of the chip 200 are electrically connected to the leads 208b through respective bonding wires 206b. Meanwhile, another portion of the bonding pads 202 on the upper surface of the chip 200 is electrically connected to the die pad 208b (normally ground pads) through respective bonding wires 206a. The plastic package body 210 encapsulates the chip 200, the adhesive glue 204 and the bonding wires 206a, 206b such that one side of the die pad 208a and the leads 208b are exposed. The exposed surface of the die pad 208a increases the heat dissipating capacity of the package while the exposed leads 208b facilitate electrical connection with other devices or a host board.

FIG. 3 is a schematic cross-sectional view of a conventional lead frame type of package. As shown in FIG. 3, the lead frame type package mainly comprises a chip 300, a layer of adhesive glue 304, a plurality of bonding wires 306, a lead frame 308 and a plastic package body 310. The lead frame 308 has a die pad 308a and a plurality of leads 308b. The upper surface of the chip 300 has a plurality of bonding pads 302 thereon. The back surface of the chip 300 is attached to the die pad 308a through the layer of adhesive glue 304. The bonding pads 302 on the chip 300 are electrically connected to the leads 308b through the bonding wires 306. The plastic package body 310 encapsulates the chip 300, the adhesive glue 304, the bonding wires 306, the die pad 308a and a portion of the leads 308b. Thus, the leads 308b exposed outside the package body 310 can be electrically connected with other carriers. Heat generated by the package is channeled outside through the leads or an externally attached heat sink. Consequently, heat dissipation capacity for this type of package is usually low.

All the aforementioned packages have a so-called wire-bonding chip design. In other words, the chip is electrically connected to the package through bonding wires. Bonding wires not only increase overall thickness of a package, but also increase overall circuit path compared with a conventional flip-chip packaging technique. Moreover, to package a wire-bonding chip into a flip-chip package, a wiring redistribution is required. After the redistribution process, overall circuit length will be increased so that a parasitic inductance problem may crop up.

SUMMARY OF THE INVENTION

Accordingly, one object of the present invention is to provide a thermally enhanced package and a method of fabricating the same that can reduce overall thickness of the package and provide a shorter overall circuit length.

To achieve these and other advantages and in accordance with the purpose of the invention, as embodied and broadly described herein, the invention provides a thermally enhanced package. The thermally enhanced package mainly comprises a heat sink, a carrier, a layer of adhesive glue, a plurality of first electrical contacts, a silicon chip, a plurality of second electrical contacts and a plastic package body. The heat sink has a cavity. The carrier mounts over the heat sink. Since the heat sink has a cavity, a chip cavity for accommodating the silicon chip is formed between the carrier and the heat sink. The heat sink and the carrier are bonded together through the adhesive glue. The layer of adhesive glue has a plurality of openings that exposes the first electrical contacts. Through the first electrical contacts, the heat sink and a portion of the area on the carrier (such as ground leads and die pad) are electrically connected. The chip is enclosed inside the chip cavity above the carrier. The chip is electrically connected to the carrier through the second electrical contacts. The plastic package body fills up the chip cavity so that the chip and the cavity type carrier form a solid body.

In the thermally enhanced package of this invention, the first electrical contacts within the adhesive glue are solder balls, for example. The second electrical contacts for connecting the chip and the carrier electrically are gold bumps or solder bumps. The gold bumps are, for example, the gold stud bumps formed by a wire bond machine or the gold stud bumps formed by electroplating.

The carrier inside the thermally enhanced package is a lead frame, for example. The lead frame includes, for example, a die pad and a plurality of leads around the die pad. Each lead can be divided into an inner lead section and an outer lead section. In addition, the die pad and the outer leads are on a different plane (height), thereby providing a space for accommodating a chip.

The heat sink of the thermally enhanced package is electrically connected to the die pad on the lead frame and a portion of the leads (such as the ground lead) through the first electrical contacts within the adhesive glue. Hence, the heat sink is actually connected to the ground.

In the thermally enhanced package, the gap between the die pad of the lead frame and the active surface of the chip may include a layer of adhesive glue, for example.

The carrier inside the thermally enhanced package may be a tape carrier, for example. The tape carrier comprises a tape, a die pad and a plurality of leads surrounding the die pad. The die pad and the leads are laid on the tape. Each lead is divided into an inner lead section and an outer lead section. In addition, the die pad and the outer leads are on a different plane (at different height levels) to produce a space for accommodating a chip.

The heat sink of the thermally enhanced package is electrically connected to the die pad on the tape carrier and a portion of the leads (such as the ground leads) through the first electrical contacts within the adhesive glue. Hence, the heat sink is actually connected to the ground.

The chip inside the thermally enhanced package may connect to the leads through bonding wires or directly through a flip chip design. Furthermore, adhesive glue may be used to fill the gap between the active surface of the chip and the die pad of the tape carrier.

This invention also provides a method of fabricating a thermally enhanced package. First, a heat sink with a cavity thereon is provided. A layer of adhesive glue with a plurality of openings therein is formed over the heat sink. A first electrical contact is formed inside the openings. A carrier is attached to the heat sink through the adhesive glue. The carrier has a cavity that corresponds in position to the cavity on the heat sink so that a space for accommodating a chip is formed. A silicon chip having an active surface is provided. The active surface of the chip has a plurality of bonding pads thereon. A second electrical contact is formed on each bonding pads of the chip. The chip is next positioned inside the chip cavity followed by conducting a thermal compression process so that the chip and the carrier are electrically connected through the second electrical contacts. Finally, plastic material is injected into the chip cavity in a molding process.

The carrier inside the thermally enhanced package can be a lead frame or a tape carrier and the chip can be a wire-bonding chip or a flip-chip, for example. The second electrical contacts can be any type of metallic bumps such as gold bumps or solder bumps. The gold bumps can be gold stud bumps formed by a wire bond machine or gold stud bumps formed by electroplating.

Before positioning the chip inside the chip cavity in the aforementioned packaging process, adhesive glue may be applied to the active surface of the chip so that the active surface of the chip may connect electrically with the heat sink through the adhesive glue and the carrier. In addition, a dicing process may be conducted to produce individual units after plastic is injected to fill all the chip cavities in an array.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
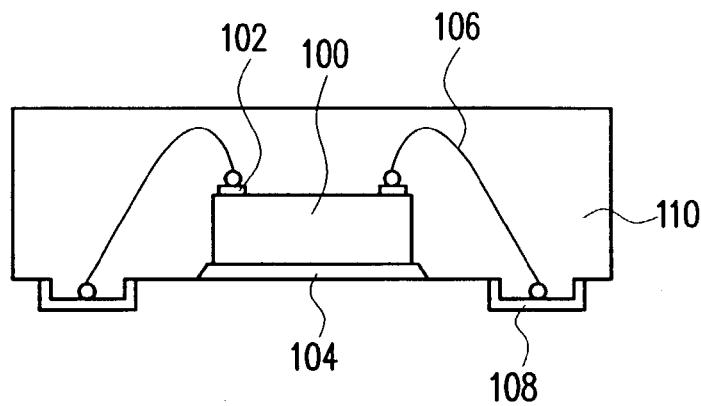
FIG. 1 is a schematic cross-sectional view of a conventional bump chip carrier package.
Figure 2:
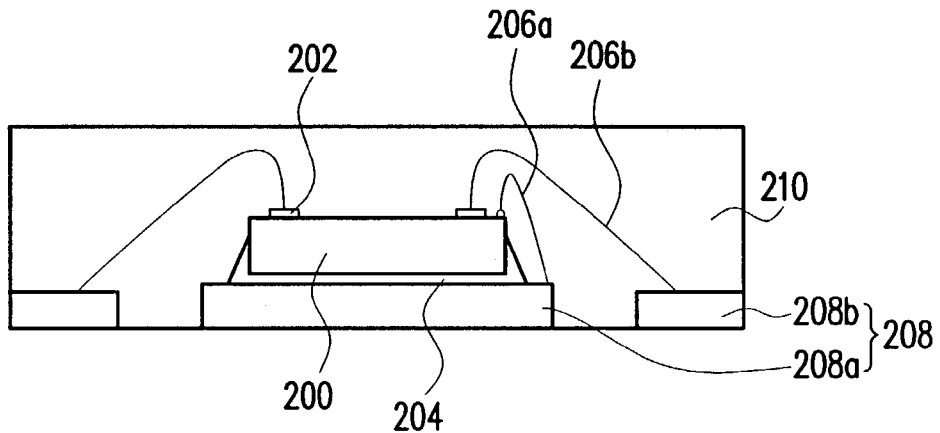
FIG. 2 is a schematic cross-sectional view of a conventional quad flat nonleaded package
Figure 3:
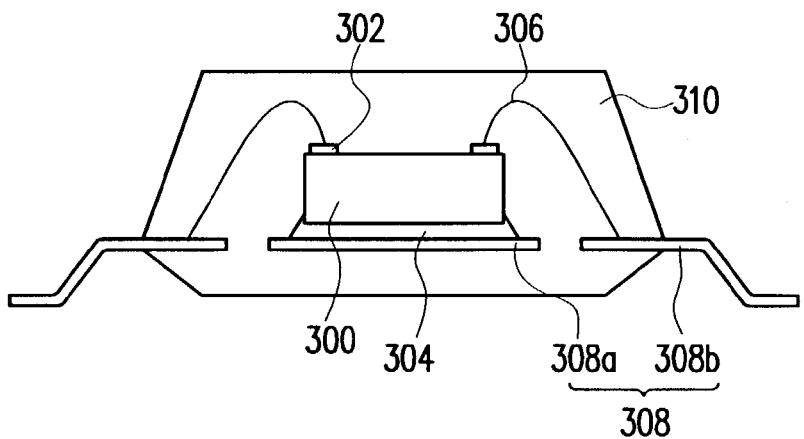
FIG. 3 is a schematic cross-sectional view of a conventional lead frame type of package.

Reference will now be made in detail to the present preferred embodiments of the invention, examples of which are illustrated in the accompanying drawings. Wherever possible, the same reference numbers are used in the drawings and the description to refer to the same or like parts.

Figure 4A:
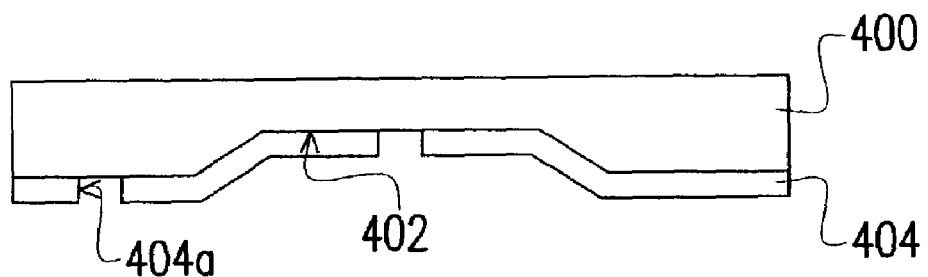
FIGS. 4A to 4F are schematic cross-sectional views showing the progression of steps for producing a thermally enhanced package according to a first embodiment of this invention.

FIGS. 4A to 4F are schematic cross-sectional views showing the fabrication steps for producing a thermally enhanced package according to a first embodiment of this invention. As shown in FIG. 4A, a heat sink 400 having a cavity 402 thereon is provided. A layer of adhesive glue 404 is formed over the surface of the cavity 402. The layer of adhesive glue 404 has a plurality of openings 404a.

Figure 4B:
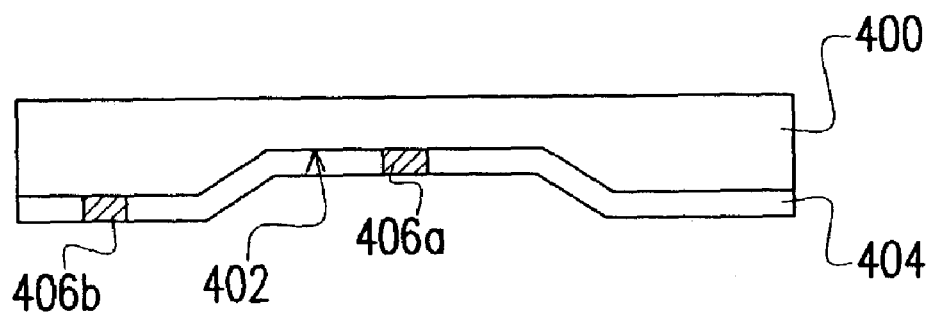

As shown in FIG. 4B, first electrical contacts 406a, 406b are formed inside the openings 404a of the adhesive glue layer 404. The first electrical contacts 406a, 406b may protrude slightly above the adhesive glue layer 404 to facilitate subsequent electrical connection with other devices or a host hoard (not shown).

Figure 4C:
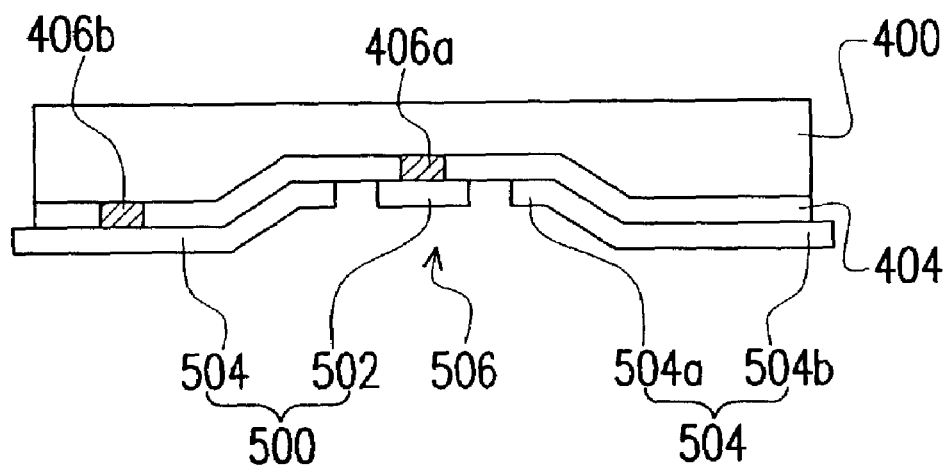

As shown in FIG. 4C, a carrier such as a lead frame 500 is provided. The lead frame 500 has a die pad 502 and a plurality of leads 504 surrounding the die pad 502. Each lead 504 can be further divided into an inner lead section 504*a* and an outer lead section 504*b*. A portion of the leads 504 in the lead frame 500 are ground leads. These ground leads 504 are electrically connected to the heat sink 400 through the first electrical contact 406*b* and the die pad 502 on the lead frame 500 is electrically connected to the heat sink 400 through the first electrical contact 406*a*.

Since the heat sink 400 has a cavity 402, a space 506 for accommodating a chip is produced on the lead frame, 500 in a location corresponding to the cavity 402. The chip cavity 506 has a depth that depends on the type of chip to be enclosed inside the package.

Figure 4D:
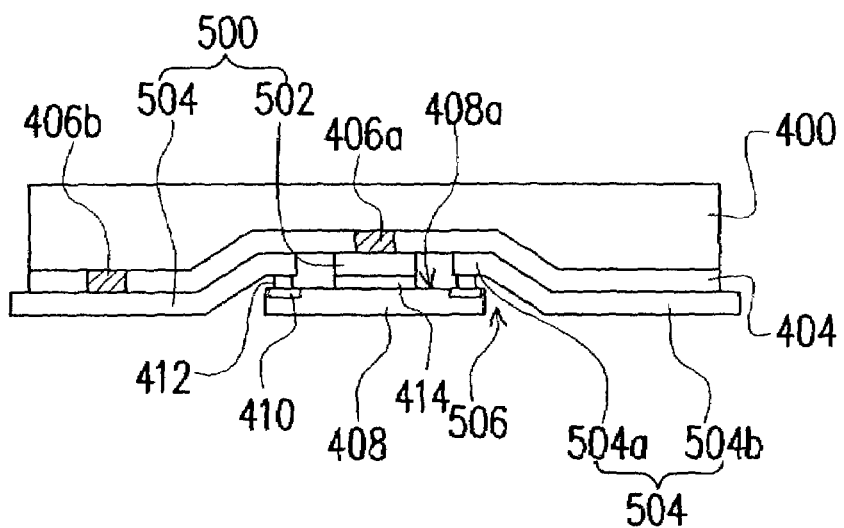

As shown in FIG. 4D, a semiconductor chip 408 is provided. The chip 408 can be an ordinary wire-bonding chip or a flip-chip. The chip 408 has an active surface 408*a* with a plurality of bonding pads 410 thereon. A second electrical contact 412 is formed over each bonding pad 410. The second electrical contact 412 are gold bumps or solder bumps, for example. The gold bumps can be, for example, gold stud bumps formed by wire bonding or gold stud bumps formed by electroplating. In addition, a layer of adhesive glue 414 may be applied over the active surface 408*a* of the chip 408. Thereafter, a thermal compression process may be carried out to form electrical connections between the chip 408 and the lead frame 500. During thermal compression, the chip 408 is electrically connected to the inner leads 504*a* of the lead frame 500 through the second electrical contacts 412. Meanwhile, the active surface 408*a* of the chip 408 also connects electrically with the heat sink 400 via the adhesive glue layer 414, the die pad 502 and the first electrical contact 406*a*.

Figure 4E:
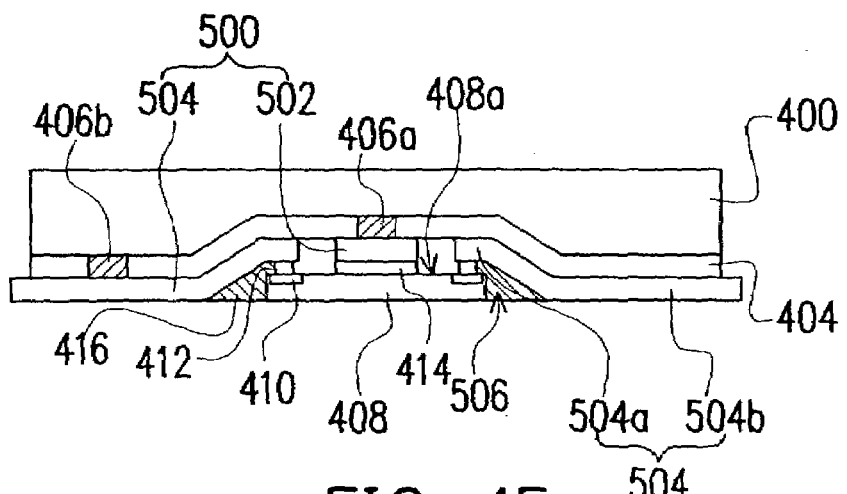

As shown in FIG. 4E, an encapsulation process is carried out. In the molding process, packaging plastic 416 is injected to fill the entire chip cavity 506. Through the packaging plastic, the chip 408 and the lead frame 500 form a solid body.

Figure 4F:
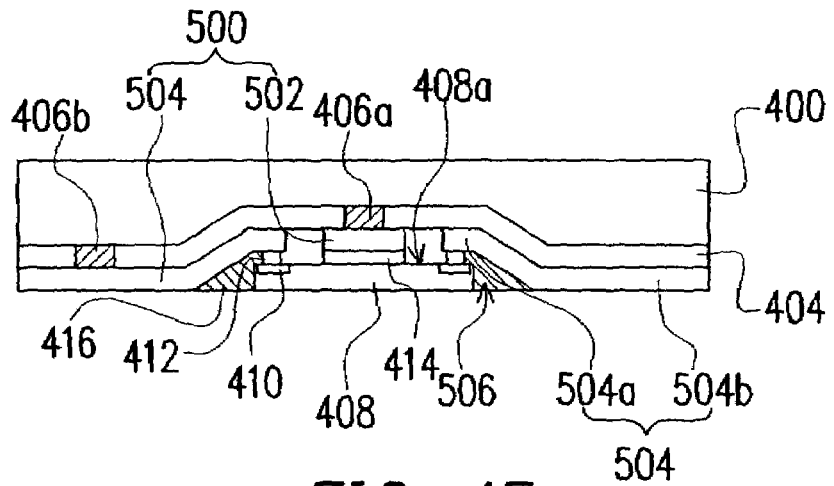

As shown in FIG. 4F, a dicing process may be carried out so that each individual package within an array is separated and excess material surrounding a package is removed.

Figure 5:
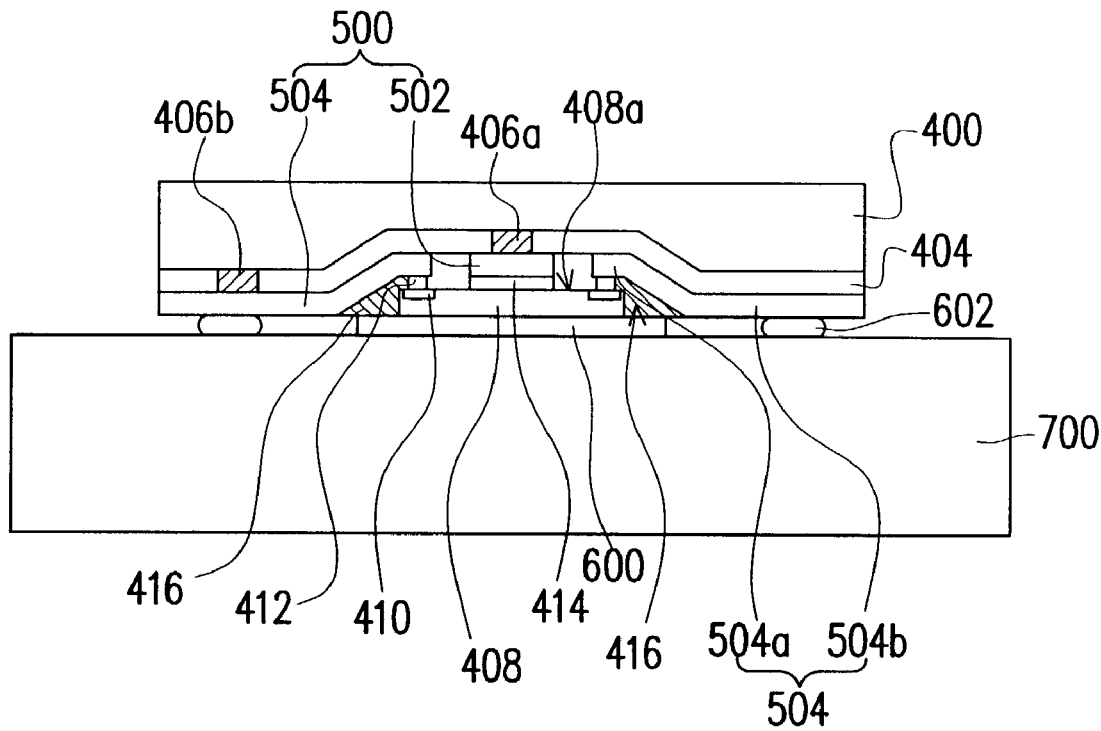
FIG. 5 is a cross-sectional view after the thermally enhanced package in FIG. 4F joins up with a printed circuit board.

FIG. 5 is a cross-sectional view after the thermally enhanced package in FIG. 4F joins up with a printed circuit board. As shown in FIG. 5, the package (in FIG. 4F) mounts on a printed circuit board 700 that serves as its carrier. The printed circuit board 700 is electrically connected to the outer leads 504*b* of the lead frame 500 so that the chip 408 forms an assembly with the printed circuit board 700.

In this embodiment, the printed circuit board 700 and the outer leads 504*b* of the lead frame 500 are electrically connected through an electrical medium such as third electrical contacts 602. The third electrical contacts 602 may be fabricated with solder paste, for example. In addition, a heat conductive pad 600 may be inserted in the gap between the printed circuit board 700 and the chip 408 so that heat can be channeled away from the back of the chip 408 via the heat conductive pad 600 to the printed circuit board 700.

Figure 6:
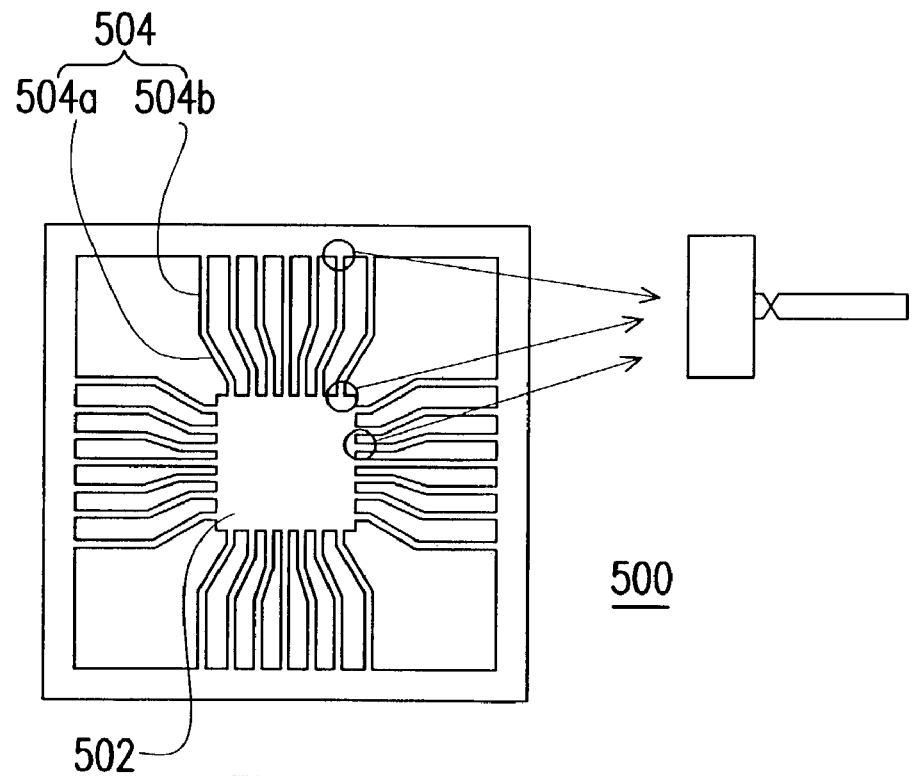
FIG. 6 is a top view of the lead frame inside the package according to the first embodiment of this invention.

FIG. 6 is a top view of the lead frame inside the package according to the first embodiment of this invention. As shown in FIG. 6, each lead 504 in the lead frame 500 can be divided into an inner lead section 504*a* and an outer lead section 504*b*. A portion of the junction between the inner leads 504*a* and the die pad 502 may employ a lead break design. The lead break design facilitates the detachment of inner leads 504*a* from the die pad 502. However, the lead break design will be removed in a subsequent operation to prevent the inner leads 504*a* and the die pad 502 from short-circuiting.

Figure 7A:
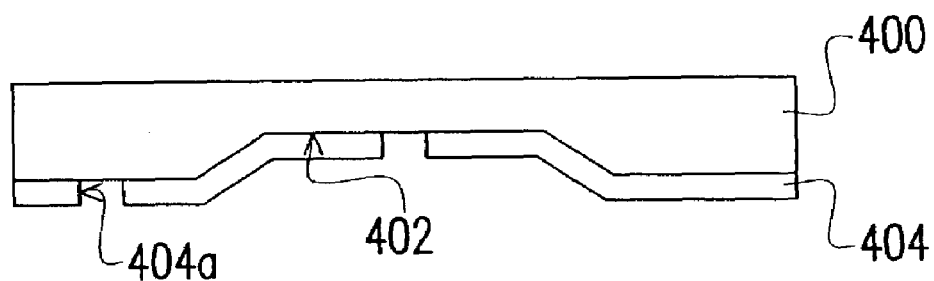
FIGS. 7A to 7F are schematic cross-sectional views showing the progression of steps for producing a thermally enhanced package according to a second embodiment of this invention.

FIGS. 7A to 7F are schematic cross-sectional views showing the fabrication steps for producing a thermally enhanced package according to a second embodiment of this invention. As shown in FIG. 7A, a heat sink 400 having a cavity 402 thereon is provided. A layer of adhesive glue 404 is formed over the surface of the cavity 402. The layer of adhesive glue 404 has a plurality of openings 404*a*.

Figure 7B:
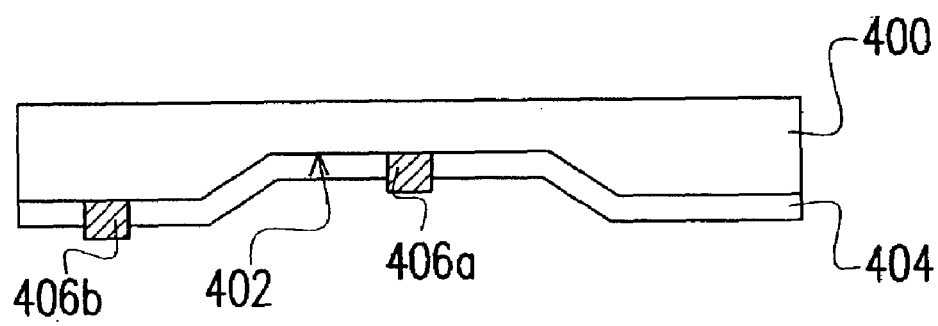

As shown in FIG. 7B, first electrical contacts 406*a*, 406*b* are formed inside the openings 404*a* of the adhesive glue layer 404. The first electrical contacts 406*a*, 406*b* may protrude slightly above the adhesive glue layer 404 to facilitate subsequent electrical connection with other devices or a host board (not shown).

Figure 7C:
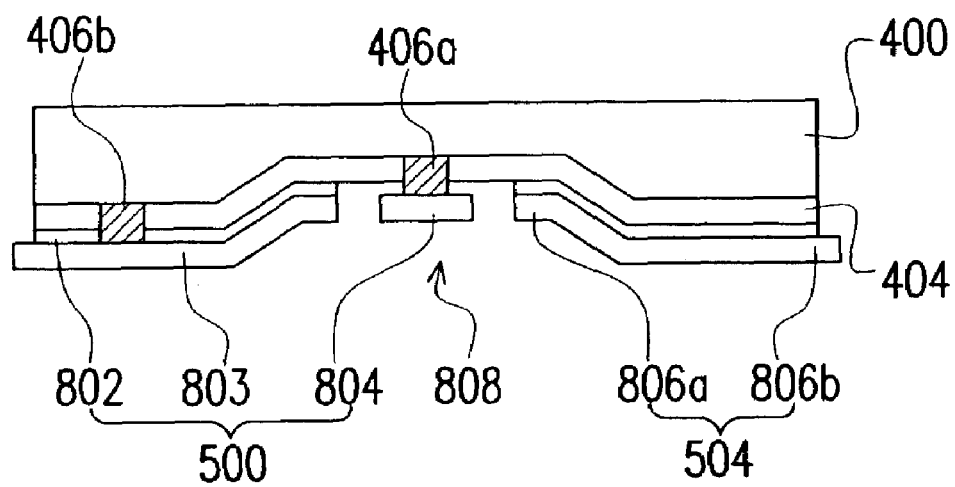

As shown in FIG. 7C, a carrier such as a tape carrier 800 is provided. The tape carrier comprises a tape 802, a die pad 804 and a plurality of leads 806 surrounding the die pad 804. Each lead 806 may be further divided into an inner lead section 806*a* and an outer lead section 806*b*. A portion of the leads 806 in the tape carrier 800 are ground leads. These ground leads 806 are electrically connected to the heat sink 400 through the first electrical contact 406*b* and the die pad 804 on the tape carrier 800 is electrically connected to the heat sink 400 through the first electrical contact 406*a*.

Since the heat sink 400 has a cavity 402, a hollow space 808 for accommodating a chip is produced on the tape carrier 800 in a location corresponding to the cavity 402. The chip cavity 808 has a depth that depends on the type of chip to be enclosed inside the package.

Figure 7D:
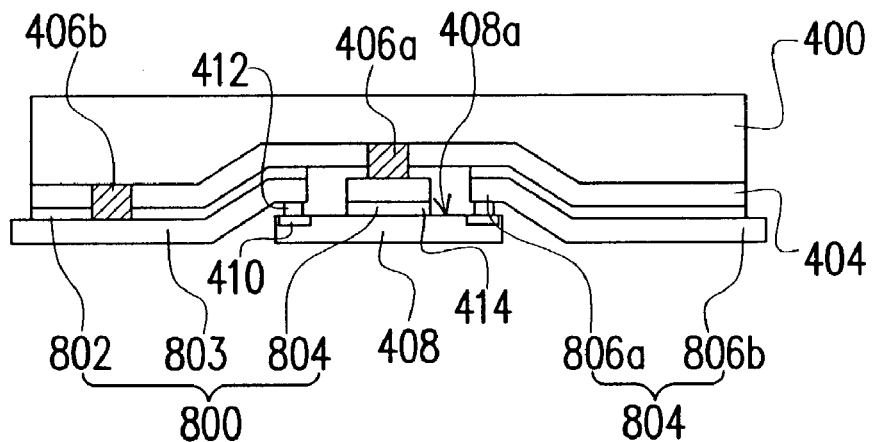

As shown in FIG. 7D, a semiconductor chip 408 is provided. The chip 408 can be an ordinary wire-bonding chip or a flip-chip. The chip 408 has an active surface 408*a* with a plurality of bonding pads 410 thereon. A second electrical contact 412 is formed over each bonding pad 410. The second electrical contact 412 are gold bumps or solder bumps, for example. The gold bumps can be, for example, gold stud bumps formed by wire bonding or gold stud bumps formed by electroplating. In addition, a layer of adhesive glue 414 may be applied over the active surface 408*a* of the chip 408. Thereafter, a thermal compression process may be carried out to form electrical connections between the chip 408 and the tape carrier 800. During thermal compression, the chip 408 is electrically connected to the inner leads 806*a* of the tape carrier 800 through the second electrical contacts 412. Meanwhile, the active surface 408*a* of the chip 408 also connects electrically with the heat sink 400 via the adhesive glue layer 414, the die pad 804 and the first electrical contact 406*a*.

Figure 7E:
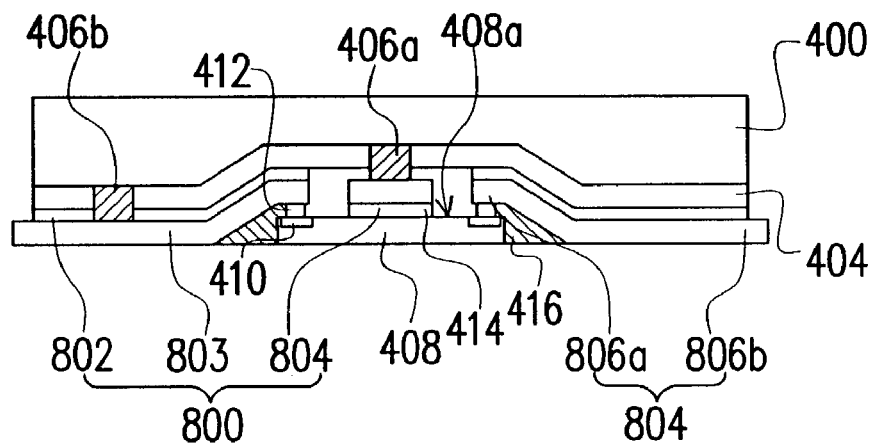

As shown in FIG. 7E, an encapsulation process is carried out. In the process, packaging plastic 416 is injected to fill the entire chip cavity 808. Through the packaging plastic, the chip 408 and the tape carrier 800 form a solid body.

Figure 7F:
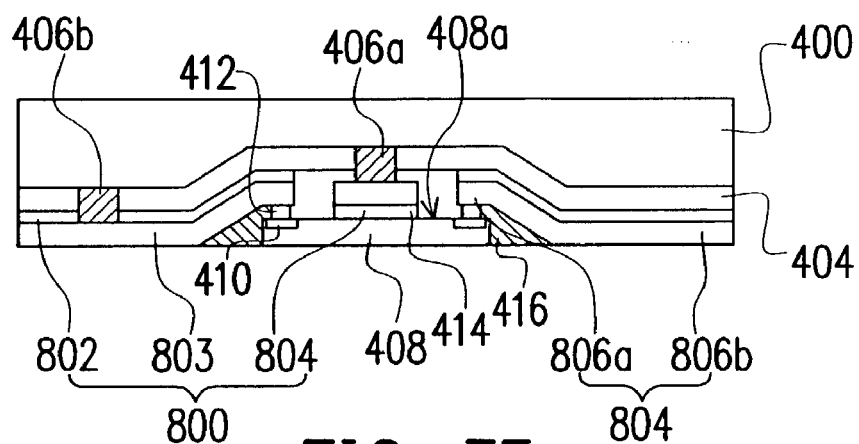

As shown in FIG. 7F, a dicing process may be carried out so that an individual package within an array is separated and excess material surrounding a package is removed.

Figure 8:
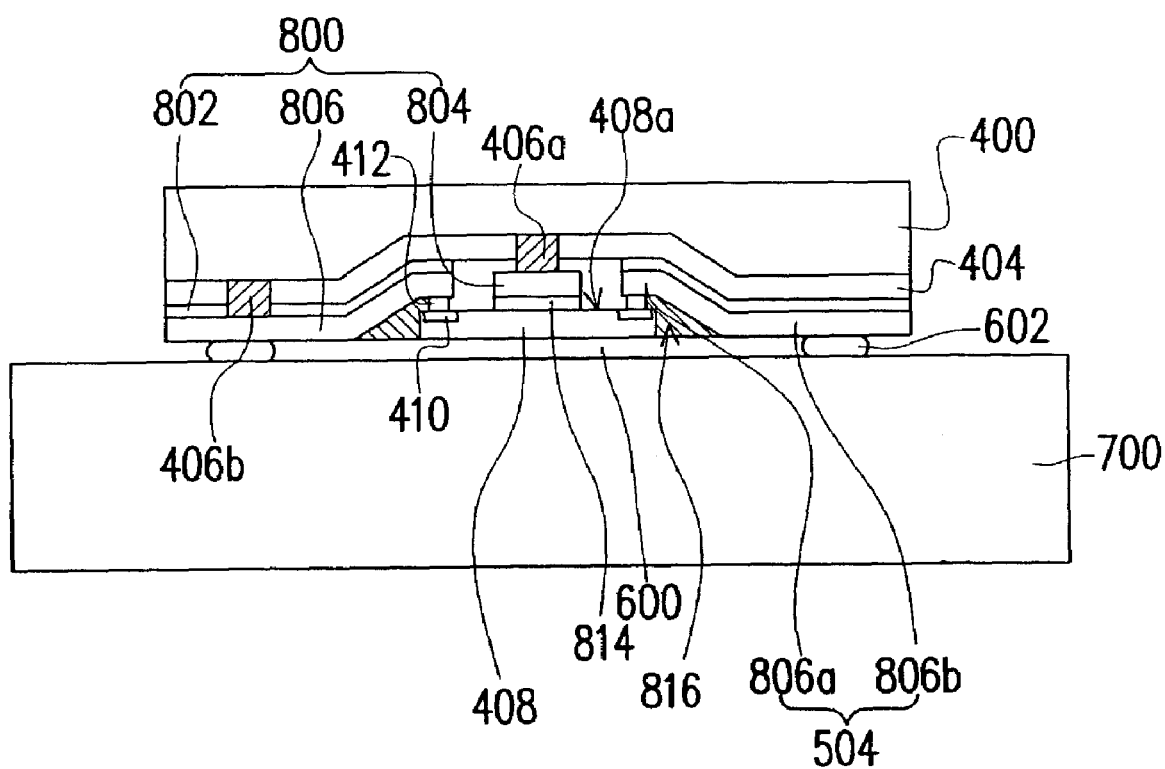
FIG. 8 is a cross-sectional view after the thermally enhanced package in FIG. 7F joins up with a printed circuit board.

FIG. 8 is a cross-sectional view after the thermally enhanced package in FIG. 7F joins up with a printed circuit board. As shown in FIG. 8, the package (in FIG. 4F) mounts on a printed circuit board 700 that serves as its carrier. The printed circuit board 700 is electrically connected to the outer leads 806*b* of the tape carrier 800 so that the chip 408 forms an assembly with the printed circuit board 700.

In this embodiment, the printed circuit board 700 and the outer leads 806*b* of the tape carrier 800 are electrically connected through electrical medium such as third electrical contacts 602. The third electrical contacts 602 may be formed with solder paste, for example. In addition, a heat conductive pad 600 may be inserted in the gap between the printed circuit board 700 and the chip 408 so that heat can be channeled away from the back side of the chip 408 via the heat conductive pad 600 to the printed circuit board 700.

Figure 9A:
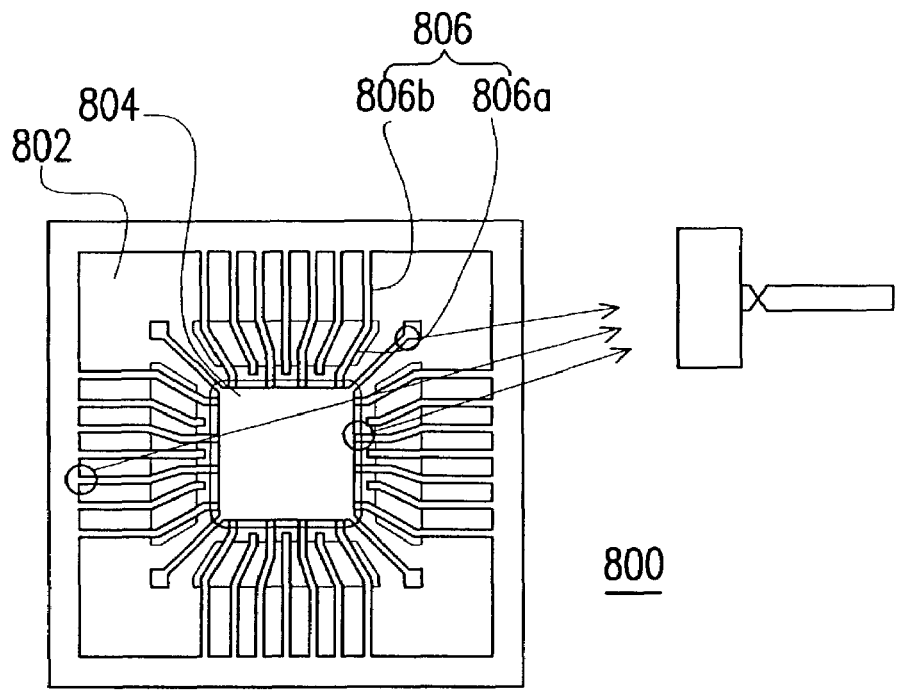
FIGS. 9A to 9C are top views of the tape carrier used in a second embodiment of this invention.
Figure 9B:
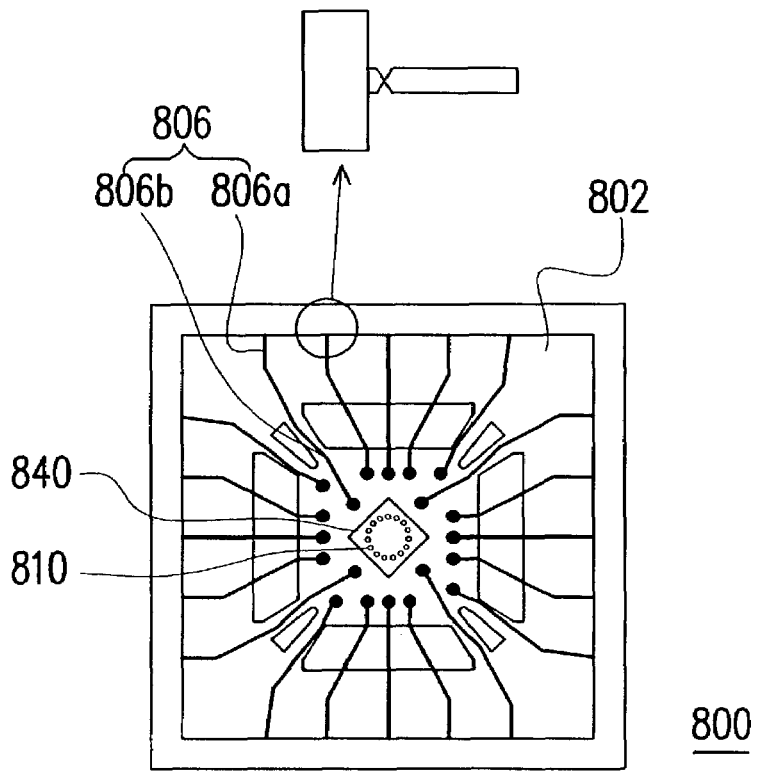
Figure 9C:
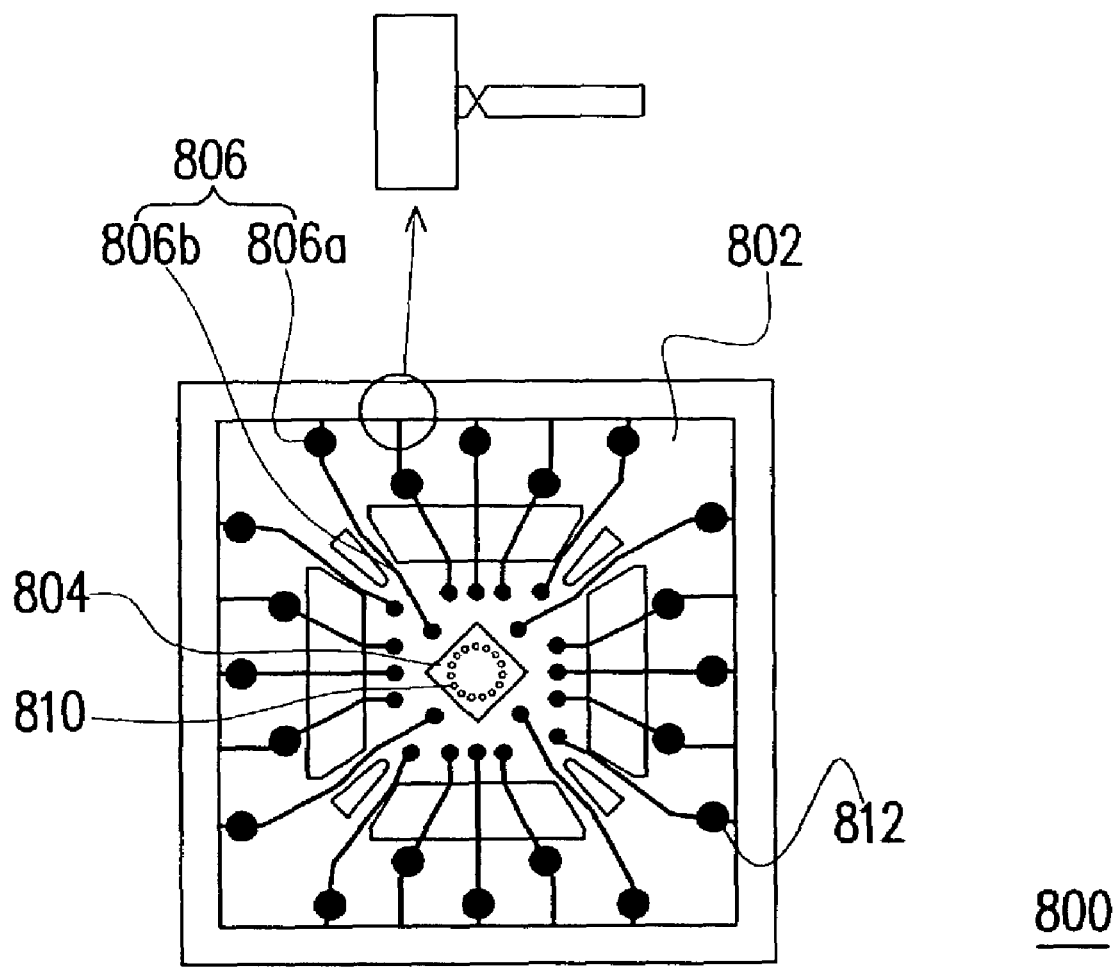

FIGS. 9A to 9C are top views of the tape carrier used in a second embodiment of this invention. As shown in FIGS. 9A, 9B and 9C, each lead 806 can be divided into an inner lead section 806a and an outer lead section 806b. A portion of the junction between the inner leads 806a and the die pad 804 may employ a lead break design. The lead break design facilitates the detachment of inner leads 806a from the die pad 804. However, the lead break design will be removed in a subsequent operation to prevent the inner leads 806a and the die pad 804 from short-circuiting.

As shown in FIG. 9A, the position of the opening on the tape carrier 800 corresponds to the die pad 804 so that the die pad 804 is directly grounded. In FIGS. 9B and 9C, the die pad 804 and the inner leads 806a are both supported by the underlying tape 802. Furthermore, the tape 802 underneath the die pad 804 has a plurality of open holes 810. Through these open holes 810, the die pad 804 is also grounded. Moreover, in FIG. 9C, the end of each outer lead 806b includes a connecting pad 812.

In summary, the thermally enhanced package and associated method of fabrication have at least the following advantages:
1. Using either a lead frame or a tape carrier, overall area and thickness of the package can be reduced.
2. The heat sink in the package is connected to ground through electrical contacts and hence the heat sink can serve as an electromagnetic interference shield.
3. There is no need to use bonding wires to serve as an electrical connection medium. Hence, overall package size can be reduced.
4. The package permits not only the use of flip chips, but also the direct electrical connection between a wiring chip and a lead frame. Since there is no need for redistribution, overall circuit length is reduced and hence problems caused by parasitic induction are minimized. In addition, time for developing and cost for producing a new type of chip is shortened.
5. When flip-chip technique is combined with thermal compression to fabricate the package, yield and reliability of the package is improved. The shortening of average circuit path provides superior linear operation characteristics.
6. Soldering material is not required to join the tape carrier and the chip. Hence, bump pitch can be further reduced to about 45 μm.
7. The tape carrier can be designed into a variety of shapes for accommodating different types of chips.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A high performance thermally enhanced package, comprising:
a heat sink having a cavity thereon;
a carrier on the heat sink, wherein the carrier has a cavity in a location corresponding to the cavity in the heat sink for accommodating a chip, wherein the chip is a flip chip;
a layer of adhesive glue between the heat sink and the carrier, wherein the adhesive glue layer has a plurality of openings therein;
a first electrical contact inside each opening such that the carrier and the heat sink is electrically connected;
a chip positioned inside the chip cavity above the heat sink, wherein the chip has an active surface with a plurality of bonding pads thereon; and
a plurality of second electrical contacts between the bonding pads and the carrier such that the chip and the carrier are electrically connected.

2. The package of claim 1, wherein the carrier is a lead frame comprising:
a die pad; and
a plurality of leads surrounding the die pad, wherein each lead can be divided into an inner lead section and an outer lead section, and the die pad and the outer leads are on a different plane to form the chip cavity for accommodating the chip.

3. The package of claim 2, wherein the die pad is electrically connected to the heat sink through the first electrical contacts.

4. The package of claim 2, wherein a portion of the leads is electrically connected to the heat sink through the first electrical contacts.

5. The package of claim 2, wherein the package further includes another layer of adhesive glue between the die pad and the active surface of the chip.

6. The package of claim 1, wherein the carrier is a tape carrier comprising:
a tape;
a die pad on the tape; and
a plurality of leads surrounding the die pad, wherein each lead can be divided into an inner lead section and an outer lead section, and the die pad and the outer leads are on different planes to form the cavity for accommodating the chip.

7. The package of claim 6, wherein the die pad is electrically connected to the heat sink through the first electrical contacts.

8. The package of claim 6, wherein a portion of the leads is electrically connected to the heat sink through the first electrical contacts.

9. The package of claim 6, wherein the package may further include another layer of adhesive glue between the die pad and the active surface of the chip.

10. The package of claim 1, wherein the package may further include a plastic package body filling up the chip cavity so that the chip and the cavity carrier form a solid body.

11. A high performance thermally enhanced package, comprising:
a heat sink having a cavity thereon;
a carrier on the heat sink, wherein the carrier has a cavity in a location corresponding to the cavity in the heat sink for accommodating a chip;
a layer of adhesive glue between the heat sink and the carrier, wherein the adhesive glue layer has a plurality of openings therein;
a first electrical contact inside each opening such tat the carrier and the heat sink is electrically connected;
a chip positioned inside the chip cavity above the heat sink, wherein the chip has an active surface with a plurality of bonding pads thereon; and a plurality of second electrical contacts between the bonding pads and the carrier such that the chip and the cater are electrically connected, wherein the cater is a lead frame comprising:
   a die pad; and
   a plurality of leads surrounding the die pad, wherein each lead can be divided into an inner lead section and an outer lead section, and the die pad and the outer leads are on a different plane to form the chip cavity for accommodating the chip.

12. The package of claim 11, wherein the die pad is electrically connected to the heat sink through the first electrical contacts.

13. The package of claim 11, wherein a portion of the leads is electrically connected to the heat sink through the first electrical contacts.

14. The package of claim 11, wherein the package further includes another layer of adhesive glue between the die pad and the active surface of the chip.

15. The package of claim 11, wherein the chip is a wire bond chip.

16. The package of claim 11, wherein the chip is a flip chip.

17. The package of claim 11, wherein the package may further include a plastic package body filling up the chip cavity so that the chip and the cavity carrier form a solid body.

18. A high performance thermally enhanced package, comprising:
   a heat sink having a cavity thereon;
      a carrier on the heat sink, wherein the carrier has a cavity in a location corresponding to the cavity in the heat sink for accommodating a chip;
      a layer of adhesive glue between the heat sink and the carrier, wherein the adhesive glue layer has a plurality of openings therein;
      a first electrical contact inside each opening such that the carrier and the heat sink is electrically connected;
      a chip positioned inside the chip cavity above the heat sink, wherein the chip has an active surface with a plurality of bonding pads thereon; and
      a plurality of second electrical contacts between the bonding pads and the carrier such that the chip and the carrier are electrically connected wherein the carrier is a tape carrier comprising:
   a tape;
   a die pad on the tape; and
   a plurality of leads surrounding the die pad, wherein each lead can be divided into an inner lead section and an outer lead section, and the die pad and the outer leads are on different planes to form the cavity for accommodating the chip.

19. The package of claim 18, wherein the die pad is electrically connected to the heat sink through the first electrical contacts.

20. The package of claim 18, wherein a portion of the leads is electrically connected to the heat sink through the first electrical contacts.

21. The package of claim 18, wherein the package may further include another layer of adhesive glue between the die pad and the active surface of the chip.

22. The package of claim 18, wherein the chip is a wire bond chip.

23. The package of claim 18, wherein the chip is a flip chip.

24. The package of claim 18, wherein the package may further include a plastic package body filling up the chip cavity so that the chip and the cavity carrier form a solid body.

* * * * *